United States Patent
Chan (10) Patent No.: US 9,658,286 B2
(45) Date of Patent: May 23, 2017

(54) SEQUENTIAL ACCESS ASSEMBLY STRIP TEST ADAPTER

(71) Applicant: Wei Keong Chan, Klang (MY)

(72) Inventor: Wei Keong Chan, Klang (MY)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 324 days.

(21) Appl. No.: 14/574,398

(22) Filed: Dec. 18, 2014

(65) Prior Publication Data
US 2016/0178693 A1   Jun. 23, 2016

(51) Int. Cl.
*G01R 31/28* (2006.01)
*G01R 1/073* (2006.01)
*G01R 1/04* (2006.01)

(52) U.S. Cl.
CPC .................. *G01R 31/2889* (2013.01)

(58) Field of Classification Search
CPC .. G01R 31/2889; G01R 1/0408; G01R 1/073; G01R 31/2863; G01R 31/2896; G01R 31/2815; G01R 31/2886; G01R 31/31905; G01R 31/26; G01R 31/275; G01R 31/2867; G01R 1/04; G01R 1/07335; G01R 1/0433; H01L 2924/00; H01L 2924/00014; H01L 2924/0002
USPC .... 324/537, 757.01, 757.02, 757.04, 757.05, 324/762.01, 762.02, 762.03, 762.04, 324/762.05, 762.06
See application file for complete search history.

(56) References Cited

U.S. PATENT DOCUMENTS

| | | | | |
|---|---|---|---|---|
| 5,247,248 A | * | 9/1993 | Fukunaga | G01R 31/2863 |
| | | | | 324/750.05 |
| 6,392,427 B1 | * | 5/2002 | Yang | G11C 29/56 |
| | | | | 324/750.16 |
| 6,720,786 B2 | | 4/2004 | Song | |
| 7,388,396 B2 | | 6/2008 | Lu | |
| 2008/0188015 A1 | * | 8/2008 | Sangaunwong | G01R 31/2863 |
| | | | | 438/15 |

(Continued)

OTHER PUBLICATIONS

David Huntley, "Cost Benefit of Strip Testing", Solid State Technology, Insights for Electronics Manufacturing, http://electroiq.com.blog/2003/11/cost-benefit-of-strip-test/, 2003.

(Continued)

*Primary Examiner* — Tung X Nguyen
*Assistant Examiner* — Lee Rodak
(74) *Attorney, Agent, or Firm* — Charles E. Bergere (57) ABSTRACT

An assembly strip test method and adapter allows for the concurrent loading of multiple assembly strips for testing in a concurrent and/or round-robin fashion in a strip tester. The test method and adapter allows the multiple assembly strips to be loaded into a strip tester in a single load cycle, reducing assembly strip load cycle overhead. Signals generated by test probes can be used to select between the loaded assembly strips for testing via the strip tester. Parallel coupling between corresponding pins of corresponding integrated circuits of different assembly strips allows a single test probe to be used as stimulus or monitor for two or more assembly strips. In certain configurations a stackable assembly strip test adapter is used. In other configurations the integrated circuits include at least part of the assembly strip selection decoding logic.

16 Claims, 9 Drawing Sheets

(56) References Cited

U.S. PATENT DOCUMENTS

2010/0109699 A1    5/2010  Anderson
2013/0120019 A1    5/2013  Gibbs
2013/0297248 A1*  11/2013  Dawson ........... G01R 31/31718
                                              702/122

OTHER PUBLICATIONS

Amkor Technology, "Service Solutions, Strip Test", Brochure SS17F, Oct. 2012.
StatsChippac, "Test Services, Strip Test", Webpage: www.statschippac.com/services/testservices/striptest.aspx.

* cited by examiner

SEQUENTIAL ACCESS ASSEMBLY STRIP TEST ADAPTER

BACKGROUND OF THE INVENTION

The present invention relates generally to integrated circuit testing, and more particularly to methods of accelerating strip testing.

In the design and fabrication of integrated circuits, individual circuits are designed using Electronic Design Automation (EDA) tools. When a design is completed (after logic design, layout, simulation, etc.), the design is taped out, which means the design is saved in a form that can be used by a wafer fabrication facility to form an integrated circuit of the design on a semiconductor wafer. An integrated circuit includes input and output (I/O) pads, including power and ground pads, as is known in the art.

After the design is taped out, multiple instances of the integrated circuit are formed on a semiconductor wafer, with the individual instances known as dies. Integrated circuits are typically manufactured by forming a two-dimensional array of identical dies on the wafer. The integrated circuits may include I/O or bond pads as well as probe pads that are used for testing the integrated circuits.

Once fabricated, the integrated circuit dies are initially tested while still part of the two-dimensional matrix on the wafer using wafer probing to distinguish potentially fault-free dies from clearly defective dies.

The integrated circuit dies are then cut out of the wafer along sealing lines and mounted on lead frames or assembly strips in preparation for formation of individually packaged devices.

Once mounted on lead frames, the integrated circuits are ready for strip testing. The dies may be packaged at this point or simply secured to and bonded out to the lead frame.

Strip testing typically is the final electrical verification of the integrated circuits. Prior to performing strip test, the devices are electrically isolated. Then, following the test process, traditional end-of-line operations occur, including marking, device singulation, vision sort, tape & reel (i.e., placed on a tape and reel), packing and shipping.

Figure 1:
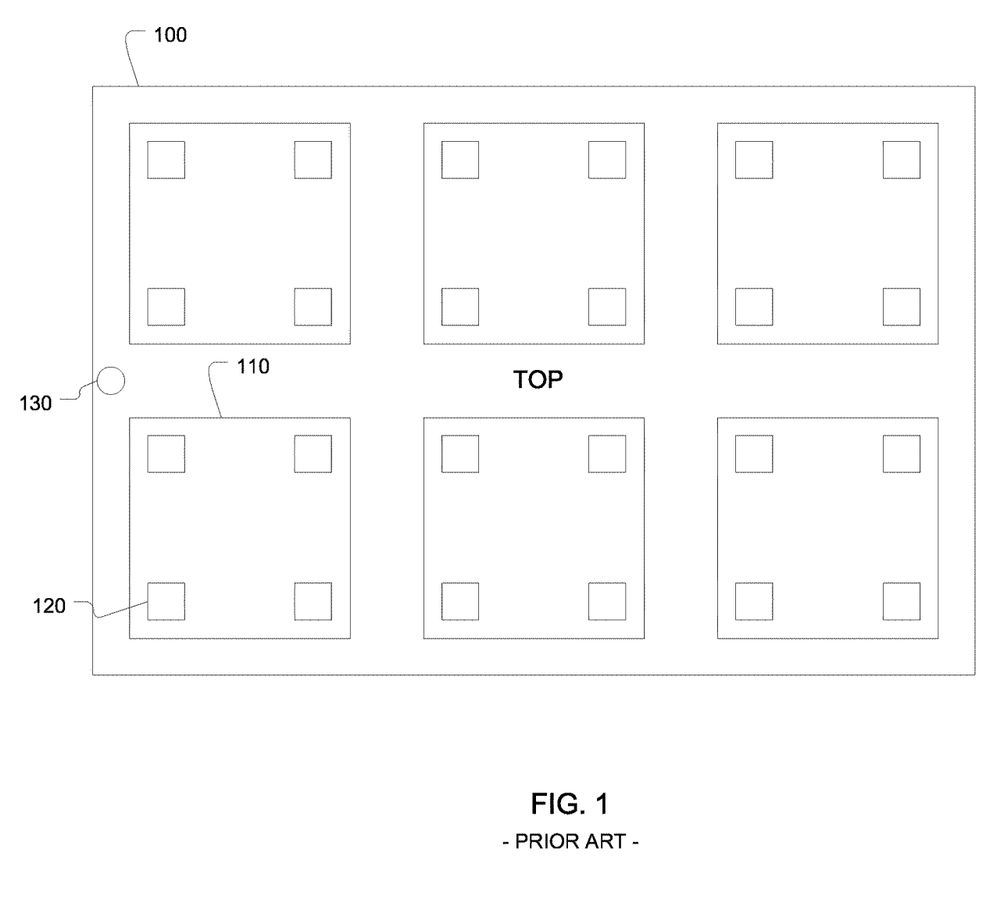
FIG. 1 is a simplified plan view of a conventional assembly strip.

FIG. 1 is a plan view of a conventional assembly strip 100 that includes six integrated circuits 110 arranged in a 2×3 matrix as well as a fiducial marker or cut-out 130.

Each integrated circuit 110 includes four test points, each similar to the test point 120. Each test point may correspond to a power, ground, or I/O pad on an un-encapsulated die, or other type of circuit contact point such as a preformed lead or bump on an encapsulated die that has been "bonded out" prior to singulation. Each integrated circuit 110 will include power and ground connections that may or may not be shown in various illustrations or may be assumed to be among the plurality of test points illustrated for each integrated circuit.

The fiducial marker or cut-out 130 may be used for alignment and/or disambiguation of the orientation of the assembly strip 100 with respect to a strip tester (not shown in FIG. 1).

Figure 2:
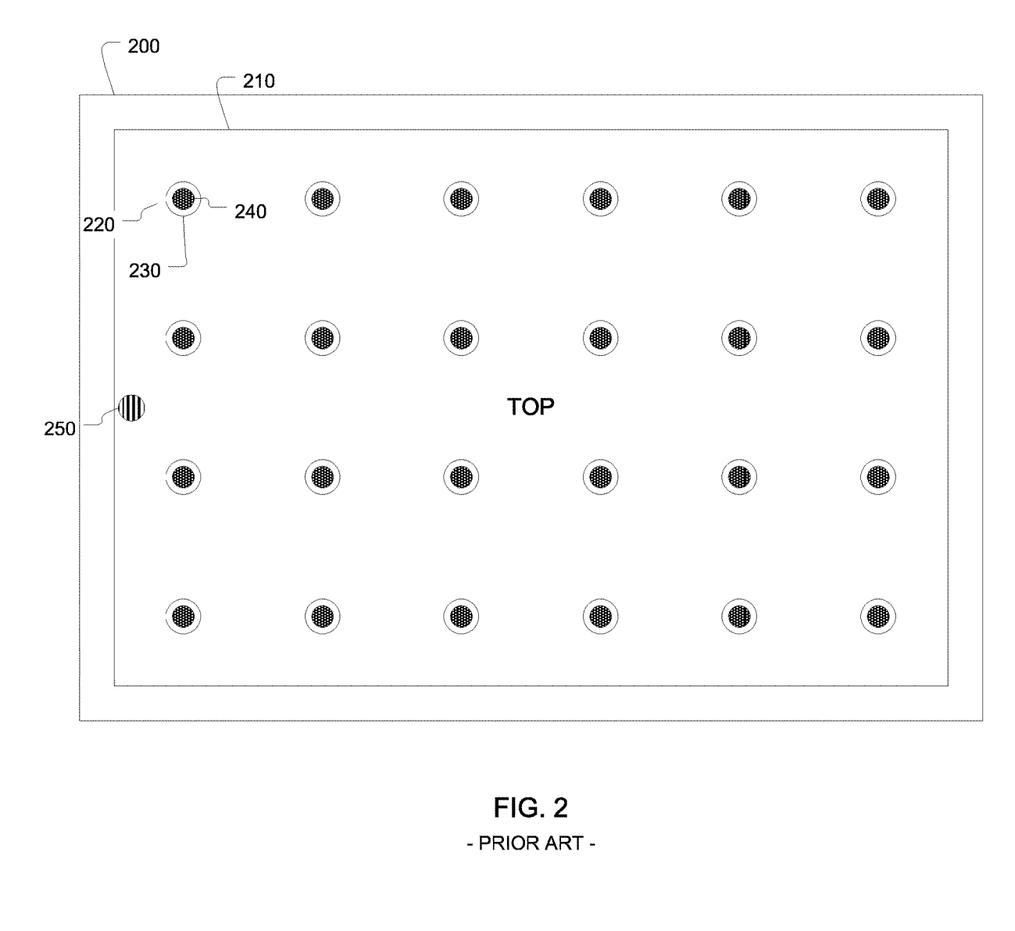
FIG. 2 is a simplified plan view of a conventional bed-of-nails strip tester.

FIG. 2 is a plan view of a "bed of nails" type strip tester 200 that includes test bed 210 and a plurality of spring loaded "pogo pin" test probes 220 within the test bed 210. The probes 220 are typically arranged in a matrix and spaced such that each probe 220 corresponds with the position of a test point on an assembly strip that is loaded into the test bed 210. For example, a probe 220 may be located in a position such that, when an assembly strip, such as the assembly strip 100 of FIG. 1, is flipped over and loaded into the test bed 210, the probe 220 will make contact with an appropriate test point, such as the test point 120 of circuit 110. Other probes 220 within the strip tester 200 may similarly be spaced in positions corresponding to the positions of the test points 120 on the circuits 110 of the assembly strip 100.

In various illustrations, power and ground might not be explicitly shown for assembly strips or testers, but may be understood to be included, either supplied by power/ground planes or bars, or special connections (not shown) supplied by the tester, or in some cases by special power and ground test probes.

Each test probe 220 may include an outer sleeve 230 and an inner pin 240 configured so that the inner pin 240 may telescopically extend from within the outer sleeve away from the test bed 210 and toward a test point 120.

Typically, the inner pin 240 of each test probe 220 is spring loaded so that it will make good contact with a test point on an assembly strip that may be loaded into the test bed 210, while also accommodating slight variations in the relative height of the test points on the assembly strip. Once in contact with a test point of an integrated circuit that is part of an assembly strip, the test probe 220 may (i) provide (a) a power or ground connection or (b) a stimulus signal (either analog or digital or a combination of both) or (ii) serve as a monitor probe to "read" the value (either by sensing a logical level or by using an analog-to-digital converter to determine an analog voltage level) that is output by the test point on the integrated circuit. In general, test probes may be dynamically repurposed between stimulus, response (e.g., monitoring), and/or power/ground functions. In some cases, there may be test points that are unused, for example, when the bed-of-nails pattern is denser than the test point matrix, or when some pins or outputs of the integrated circuits are a "don't care" at a given level of testing. Also, in general, a tester may have fewer programmable "channels" associated with a matrix of probes than there are physical probes or vice-versa.

A fiducial mark 250 may be provided in the tester 200 to help with the loading of an assembly strip into the tester 200 at the proper orientation by alignment with corresponding fiducial marks on the assembly strip, such as the fiducial mark 130 of the assembly strip 100 of FIG. 1.

The boundary of the test bed 210 of the strip tester 200 or a similar arrangement may serve to help align an assembly strip that is loaded into the tester so that test points on the circuits of the assembly strip can maintain alignment with the appropriate corresponding test probes during testing.

Test points such as the test point 120 of the circuit 110 are typically on the top surface of the assembly strip 100. Thus, in practice, the assembly strip 100 is flipped over to make contact with the test probes 220 of the tester 200. However, other arrangements are possible as would be understood to one skilled in the art, including routing of test points to the bottom of the strip assembly and use of a bottom-loading test bed, or use of a tester with a top-loading bed of nails that would press down onto the top of a loaded assembly strip.

Figure 3:
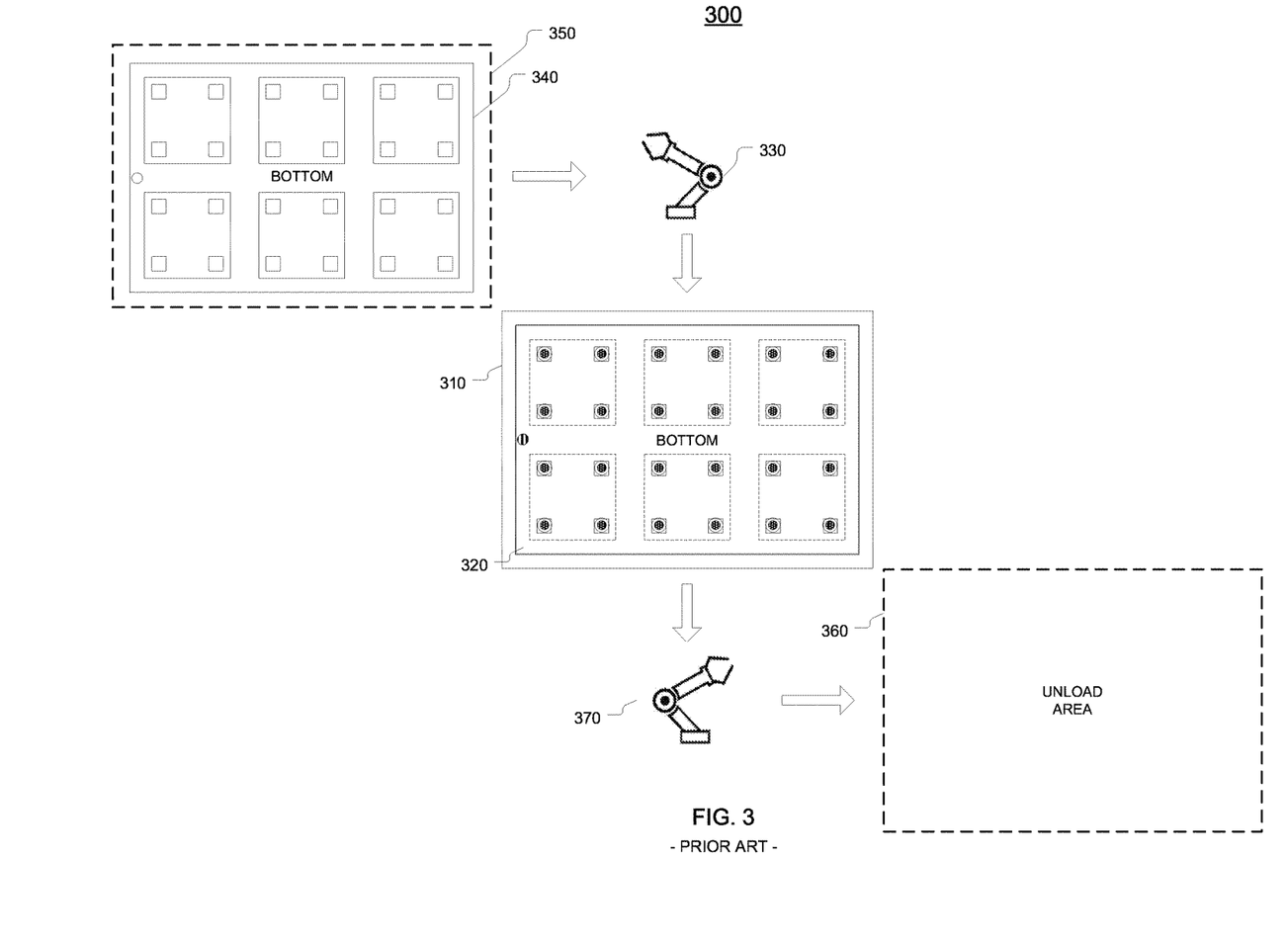
FIG. 3 is a simplified plan view of a conventional strip-testing facility.

FIG. 3 is a plan view of a snapshot in time of a typical strip-testing setup 300. A strip tester 310 is loaded with a first assembly strip 320, which is undergoing test and which was loaded, bottom up, into the strip tester 310's test bed, shortly before the snapshot, by a first automatic pick-and-place arm 330. (Note that, for clarity of illustration, the assembly strip 320 is made transparent in the figure so that the test probes of the strip tester 310 are visible through the test points).

The plan view includes a second assembly strip 340 with a loading area 350 and an unloading area 360.

Once testing is complete for the assembly strip 320, the assembly strip 320 will be unloaded by a second automatic pick-and-place robot arm 370 and placed in the unload area 360. Any time before or during the testing or unloading of the assembly strip 320, the next assembly strip 340 for testing may be selected or "picked," and once the unloading of the assembly strip 320 is complete, and the picking of the next assembly strip 340 is complete, the loading of the next assembly strip may begin.

The constraints on concurrency of operation vary from system to system, but, in general, for a typical system, the following rules apply:

Rule 1—You cannot load and unload the tester concurrently. In other words, unloading of a first assembly strip should occur before a second assembly strip is loaded.

Rule 2—You cannot test a strip while loading or unloading the tester.

Rule 3—You cannot pick a new assembly strip while loading another assembly strip.

Figure 4:
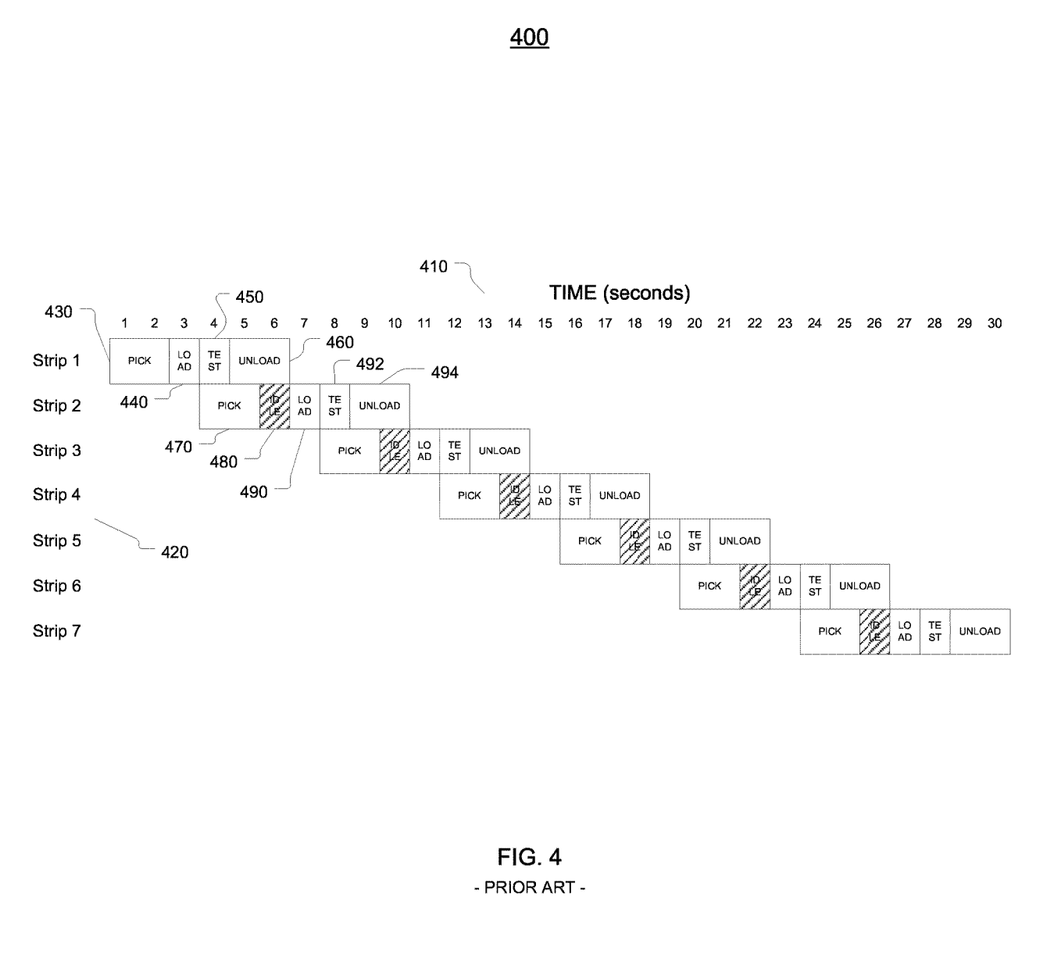
FIG. 4 is a functional timing diagram for a conventional strip-testing facility.

These rules are represented graphically in FIG. 4, which is an illustration of 30 seconds of the functional pipeline timing 400 for a typical strip test system.

FIG. 4 depicts the time in seconds along the horizontal axis 410, and the strip number along the vertical axis 420.

As shown, strip 1 is "PICK"ed 430 from an assortment of assembly strips in the first two seconds (e.g., by a first robot arm), "LOAD"ed 440 into the tester in the third second (e.g., by the same first robot arm), "TEST"ed 450 in the fourth second, and "UNLOAD"ed 460 during seconds 5 and 6 (e.g., by a second robot arm).

Following the LOAD step 440 of strip 1, a PICK step 470 of assembly strip 2 can begin in the $4^{th}$ second and overlap in time with the testing and first second of unloading of assembly strip 1. However, because of resource constraints codified in the three rules associated with FIG. 3, strip 2 cannot be "LOAD"ed 490 until the "UNLOAD"ing 460 of strip 1 is complete at the end of the $6^{th}$ second. This creates an idle period 480 before the LOAD step 490, the TEST step 492, and the UNLOAD step 494 of strip 2 can occur. Processing of strips 3 through 7 suffer similar idle periods resulting in 7 seconds of idle time being inserted in a 30-second testing cycle. Additionally, only 7 seconds of actual testing time is realized during a 30-second period, which is a significant underutilization of the strip tester 310—an expensive capital investment for a typical fabrication facility.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale. For example, the thicknesses of layers and regions may be exaggerated for clarity.

DETAILED DESCRIPTION OF THE INVENTION

Detailed illustrative embodiments of the present invention are disclosed herein. However, specific structural and functional details disclosed herein are merely representative for purposes of describing example embodiments of the present invention. The present invention may be embodied in many alternative forms and should not be construed as limited to only the embodiments set forth herein. Further, the terminology used herein is for the purpose of describing particular embodiments only and is not intended to be limiting of example embodiments of the invention.

As used herein, the singular forms "a," "an," and "the," are intended to include the plural forms as well, unless the context clearly indicates otherwise. It further will be understood that the terms "comprises," "comprising," "includes," and/or "including," specify the presence of stated features, steps, or components, but do not preclude the presence or addition of one or more other features, steps, or components. It also should be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Figure 5A:
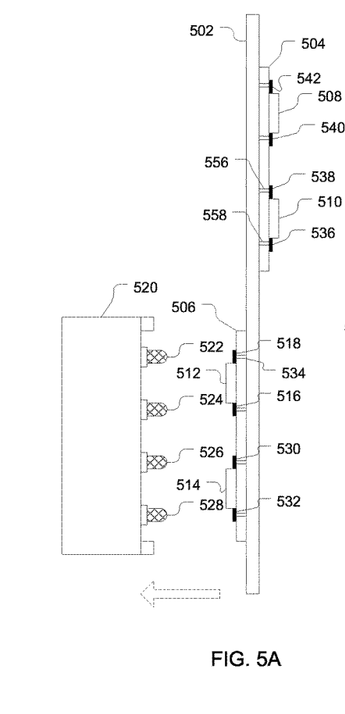
FIGS. 5A and 5B are a side view and a plan view, respectively, of an assembly strip test adapter in the context of a strip tester, according to an embodiment of the present invention.
Figure 5B:
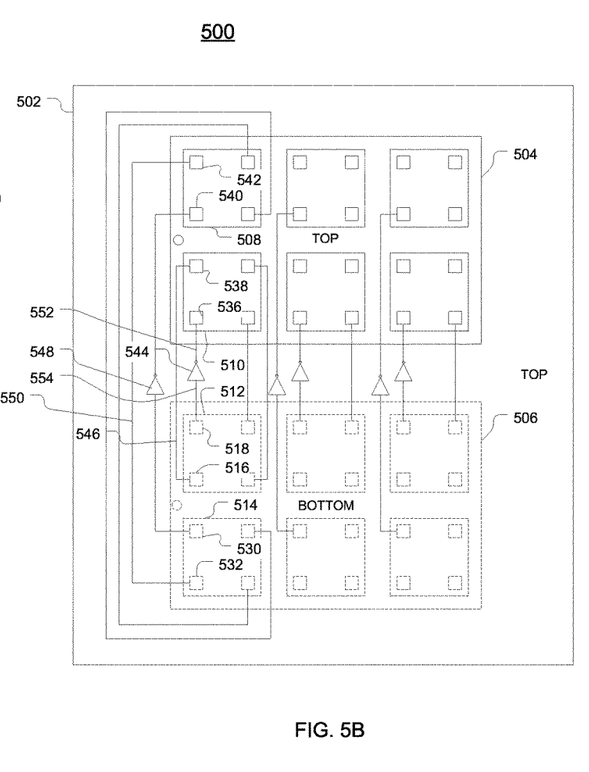

FIGS. 5A and 5B are a side view and a plan view, respectively, of a test setup 500 that includes an assembly strip test adapter 502 in the context of a strip tester 520, according to one embodiment of the present invention.

The assembly strip test adapter 502 is configured to carry a first assembly strip 504 that includes the integrated circuits 508 and 510, and a second assembly strip 506 that includes the integrated circuits 512 and 514.

The integrated circuit 512 has the test points 518 and 516, and the integrated circuit 514 has the test points 530 and 532. Each of the integrated circuits 512 and 514 has two additional test points that cannot be seen in the side view of FIG. 5A because their view is obstructed by the first two closest test points of each of the integrated circuits.

As shown in FIG. 5A, the strip tester 520 includes the test probes 522, 524, 526, and 528. The strip tester 520 also includes at least 20 additional test probes that cannot be seen in the side view of FIG. 5A, because their view is obstructed by the test probes 522, 524, 526, and 528.

In operation, the assembly strip test adapter 502 is moved in the direction of the arrow toward the strip tester 520 until the assembly strip 506 rests in the pocket created by the test bed border of the tester 520, and the test probes 522, 524, 526, and 528 make contact with the test points 518, 516, 530, and 532, respectively. Additionally, an additional 20 test probes (not shown in FIG. 5A) will make contact with an additional 20 corresponding test points on the assembly strip 506 at the same time.

A test point, such as the test point 518, may correspond to a bonded lead associated with a pre-singulated, encapsulated integrated circuit, e.g., integrated circuit 512. Alternatively, in various embodiments, the test point 518 may correspond to a bond point on an un-encapsulated die that is secured to the assembly strip 506. In either case, each test point is associated with a contact mechanism 534 (e.g., a spring-loaded contact pad and thru-hole trace) that allows the test point to be electrically connected to circuit pathways or traces on or within the assembly strip test adapter 502.

As shown in FIG. 5B, the assembly strip test adapter 502 is configured to carry the first assembly strip 504 that includes the integrated circuits 508 and 510, and the second assembly strip 506 that includes the integrated circuits 512 and 514. The first assembly strip 504 and the second assembly strip 506 are mounted on opposite sides of the assembly strip test adapter 502. In use, the assembly strip test adapter 502 maybe be maneuvered (e.g., by a pick-and-place robotic arm) such that the assembly strip 506 may be placed face down into a traditional (or slightly modified) strip tester.

The test adapter 502 includes traces and components such as the traces 546, 550, 552, and 554 and the inverter component 544. These traces and components serve to couple the test points on the second assembly strip 506 to the corresponding test points on the first assembly strip 504. For example, the test point 516 on the second assembly strip 506 is coupled to the test point 538 on the first assembly strip 504 via the trace 546, and the test point 518 on the second assembly strip 506 is coupled to the test point 536 on the first assembly strip 504 via the traces 552 and 554 and the inverter 544.

In this way, test signals provided by the strip tester 520 via test probes to test points of the second assembly strip 506 are also provided directly (or via an inverter as appropriate) to test points on integrated circuits of the first assembly strip 504.

For example, the test probe 522 of the strip tester 520 may be programmed to assert a logic 1 signal during a first phase of testing. This logic 1 signal may be applied via the test point 518 to the integrated circuit 512. It may also be carried via the contact mechanism 534 to the trace 552, which routes the signal to the inverter 544, and from there (with an inverted logic level of 0) via the trace 554 and another contact mechanism 558 to the test point 536 on the integrated circuit 510 of the first assembly strip 504.

Note that the test point 536 of the integrated circuit 510 is a corresponding test point to the test point 518 of the integrated circuit 512. The test point 518 may correspond to a chip select for the integrated circuit 512, for example. Since the integrated circuit 510 of the first assembly strip 504 is identical to the integrated circuit 512 of the second assembly strip 506, in this example, the test point 536 of the integrated circuit 510 is also a chip select. Thus, the inverter between the test point 518 and the test point 536 serves to allow a single test probe signal to be used to enable one circuit and disable the other.

Continuing with the previous example, a stimulus signal asserted by the test probe 524 would contact the integrated circuit 512 via the test point 516 and be carried via a contact mechanism 556 to the trace 546 and from there to the corresponding test point 538 of the integrated circuit 510. Alternatively, instead of asserting a stimulus signal during testing to the test points, the test probe 524 may be used to monitor a signal level output by the selected one of the two integrated circuits 512 and 510.

When the test probe 522 asserts a logic 1, it is selecting the integrated circuit 512 (e.g., enabling the integrated circuit 512 to drive its outputs or listen and respond to stimuli on its inputs), and, when the test probe 522 asserts a logic 0, it is enabling (via chip select) the integrated circuit 510 and disabling the integrated circuit 512.

Similarly, the test probe 526 will contact the test point 530 of the integrated circuit 514 (which by the prior example would be a chip select for the integrated circuit 514), and a signal asserted by the test probe 526 will be carried (via a contact mechanism and trace) to an inverter 548, and from there the inverted logic output of the inverter 548 will be carried to the test point 540 of the integrated circuit 508, which should also correspond to a chip select.

Similarly, the test probe 528 will contact the test point 532 of the integrated circuit 514 and (via a contact mechanism and trace) be able to drive a signal or monitor a signal on either the test point 532 of the integrated circuit 514 of the second assembly strip 506 or the test point 542 of the integrated circuit 508 of the first assembly strip 504, depending on the state of the signal asserted by the test probe 526.

The other test probes (not explicitly shown in FIG. 5) will form analogous connections with the other corresponding test points on the integrated circuits 512, 514, 510, and 508.

For clarity of illustration, details of the wiring between the remainder of the integrated circuits on the first and second assembly strips 504 and 506 were left out of FIGS. 5A and 5B. Suffice it to say that chip selects of corresponding integrated circuits on alternate assembly strips receive signals that are inverted from each other so circuits of only one assembly strip are selected at a time, and corresponding input or output test points of the integrated circuits are wired in parallel so signals can either be driven to test points or monitored from the test points of the circuits of the selected assembly strip.

In one embodiment, each of the 12 identical circuits of the two assembly strips 504 and 506 of FIG. 5 includes a built-in self test (BIST) that runs on power up and chip select. When an integrated circuit successfully completes a BIST, the integrated circuit drives an output to logic 1, and if the BIST fails, then the integrated circuit drives its output to logic 0.

For example, in a first test cycle, power is applied, and the test probe 522 is asserted to logic 1, selecting the integrated circuit 512, and de-selecting the integrated circuit 510. The integrated circuit 512 runs an internal BIST and passes. It asserts a logic 1 output to signify that BIST testing has passed. This signal drives the test point 516 of the integrated circuit 512 to a logic 1, which is sensed by the test probe 524. The signal also drives (via the trace 546) the test point 538 of the integrated circuit 510 high, but it is ignored because the circuit 510 is not selected.

Similarly, by using the test probe 526 to drive a logic 1 to the test point 530 of the integrated circuit 514, and by driving a logic 1 to all test probes corresponding to chip selects for the integrated circuits of the second assembly strip 506, all six integrated circuits can be tested, while ignoring the test points of the integrated circuits of the first assembly strip 504, which circuits were not chip selected during this test cycle.

On a second test cycle, the test probes 522 and 526, and all test probes associated with chip select pins on the integrated circuits of the second assembly strip 506 are asserted to a logic 0. This time only the circuits associated with the first assembly strip 504 are selected/enabled, and all of those circuits may be tested concurrently.

As can be seen from this simplified example, the assembly strip test adapter 502 makes it possible to utilize only one load period to load multiple assembly strips and to use test probes to select between the loaded assembly strips so that one may be tested at a time.

Figure 8:
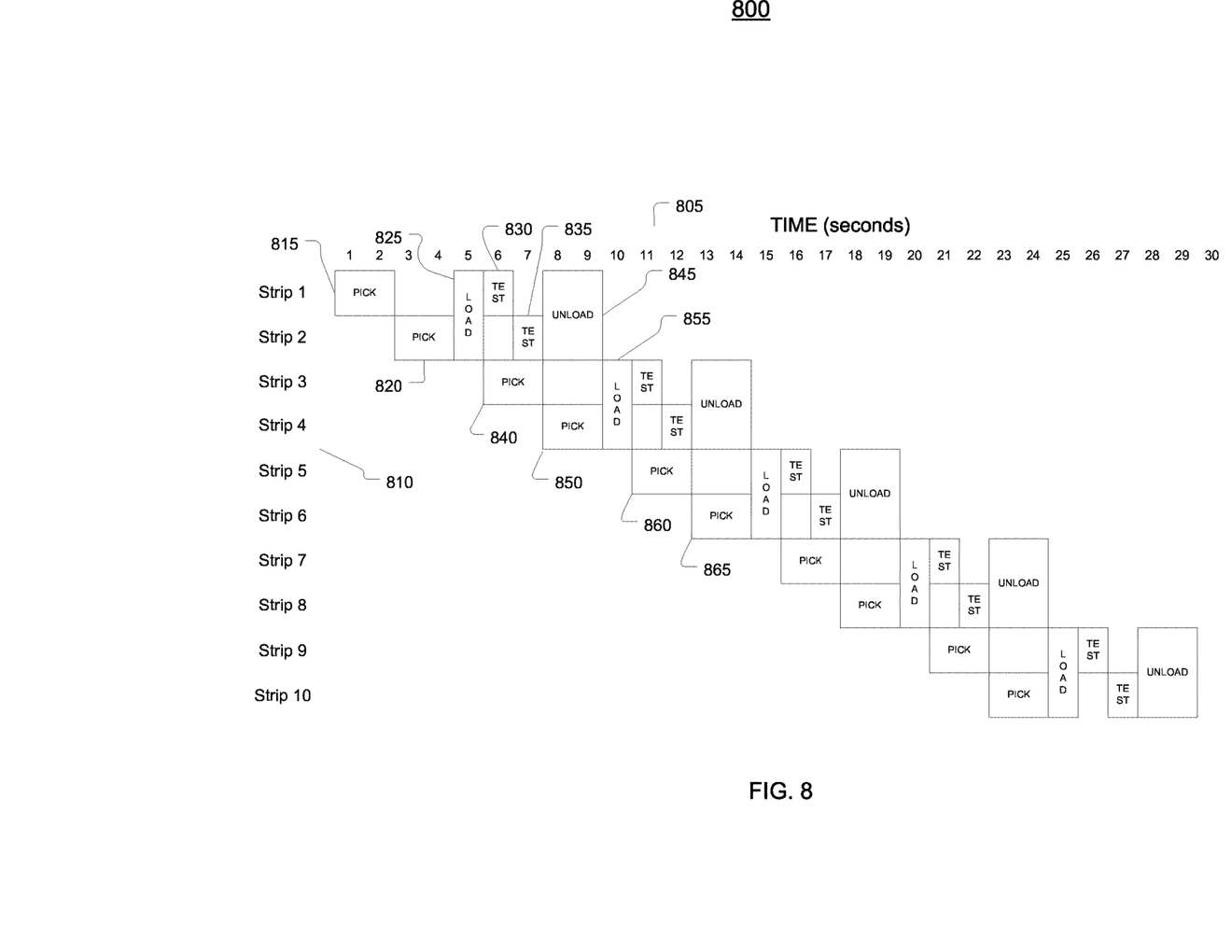
FIG. 8 is a functional timing diagram for a strip testing facility utilizing the assembly strip test adapter according to an embodiment of the present invention.

FIG. 8 illustrates 30 seconds of the functional pipeline timing 800 for the strip test setup 500 of FIGS. 5A and 5B using the dual assembly strip test adapter 502 according to one embodiment of the present invention.

Time in seconds is identified along the horizontal axis 805, and the assembly strip number involved is identified along the vertical axis 810.

As shown, assembly strip 1 is "PICK"ed 815 in the first two seconds from an assortment of assembly strips (e.g., by a first robot arm) and placed or mounted in the assembly strip adapter 502 (e.g., in the position of the first assembly strip 504). In the next 2 seconds, assembly strip 2 is "PICK"ed 820 and placed in the test adapter 502 (e.g., in the position of the second assembly strip 506). In the following second (i.e., the $5^{th}$ second), the entire assembly strip test adapter 502 (including the two mounted/socketed assembly strips) is oriented such that assembly strip 2 (now in the position of the first assembly strip 504) is aligned with the test bed of the strip tester (e.g., the strip tester 520 of FIG. 5) and then "LOAD"ed 825 therein.

In the $6^{th}$ second, the assembly strip 1 is tested 830 and, in the $7^{th}$ second, the assembly strip 2 is tested 835. Also, in seconds 6 and 7, a third assembly strip is picked 840 and placed into a second assembly strip test adapter (e.g., like the test adapter 502) into a first location. Concurrent with the unloading of the test adapter carrying the assembly strips 1 and 2 (845) in the $8^{th}$ and $9^{th}$ seconds, a fourth assembly strip is picked (850) and placed into the second test adapter. In the $10^{th}$ second, the second assembly strip test adapter is loaded (855) into the strip tester.

Strips 3 and 4 are tested in the $11^{th}$ and $12^{th}$ seconds, respectively, and the process continues with the picking and placing (intervals 860 and 865) of the $5^{th}$ and $6^{th}$ assembly strips, respectively, into a third dual test adapter for subsequent loading and testing.

Loading, testing, unloading, picking, and mounting of strips into test adapters (as well as removal of assembly strips from test adapters following unloading) continues as depicted in FIG. 8. As can be seen by comparison with the typical functional timing 400 of FIG. 4 for a system that does not utilize an assembly strip test adapter, the functional timing 800 of FIG. 8 shows no idle states and features a much higher utilization of the strip tester 520. The functional timing associated with the test adapter 502 features fully 10 assembly strips tested in a 30-second period, as opposed to only 7 tested in the same 30-second period without the test adapter 502.

Referring back to FIGS. 5A and 5B, there are many other configurations of the assembly strip test adapter 502 that may be used while staying within the scope and intent of the exemplary embodiment shown.

For example, rather than use an inverter associated with each integrated circuit, all chip selects associated with the first assembly strip 504 may be wired together and a single inverter used to drive them all from a single chip select asserted to one of the integrated circuits of the second assembly strip 506 by a probe of the strip tester 520. Additionally or alternatively, the chip selects of the second assembly strip 506 are tied together so that the tester need not assign a channel to each chip select, but may instead use one channel to select all or a plurality of the integrated circuits on a particular assembly strip.

For example, all the chip selects for the second assembly strip 506 may be wired together, and only the test probe 522 is programmed to drive the test point 518 to a logic 1. Via the contact mechanism 534 and the traces on the test adapter 502, the signal asserted by the test probe 522 may contact a chip select associated with the test point 530 of the integrated circuit 514, as well as all the other chip selects of integrated circuits on the second assembly strip 506, thereby conserving software channels associated with the corresponding probes in the strip tester 520 (and possibly avoiding a need to even populate the strip tester 520 with those probes).

In other embodiments, rather than using an inverter to do a one-of-two multiplexing between two assembly strips, two test probes may be used to drive a one-of-four decoder to select one assembly strip at a time from an assembly strip test adapter that includes three or four assembly strips with corresponding test points wired substantially (other than selector logic) in parallel.

Still more test probes may be used to select one of a plurality of assembly strips from an assembly strip test adapter carrying a plurality of assembly strips.

Figure 6:
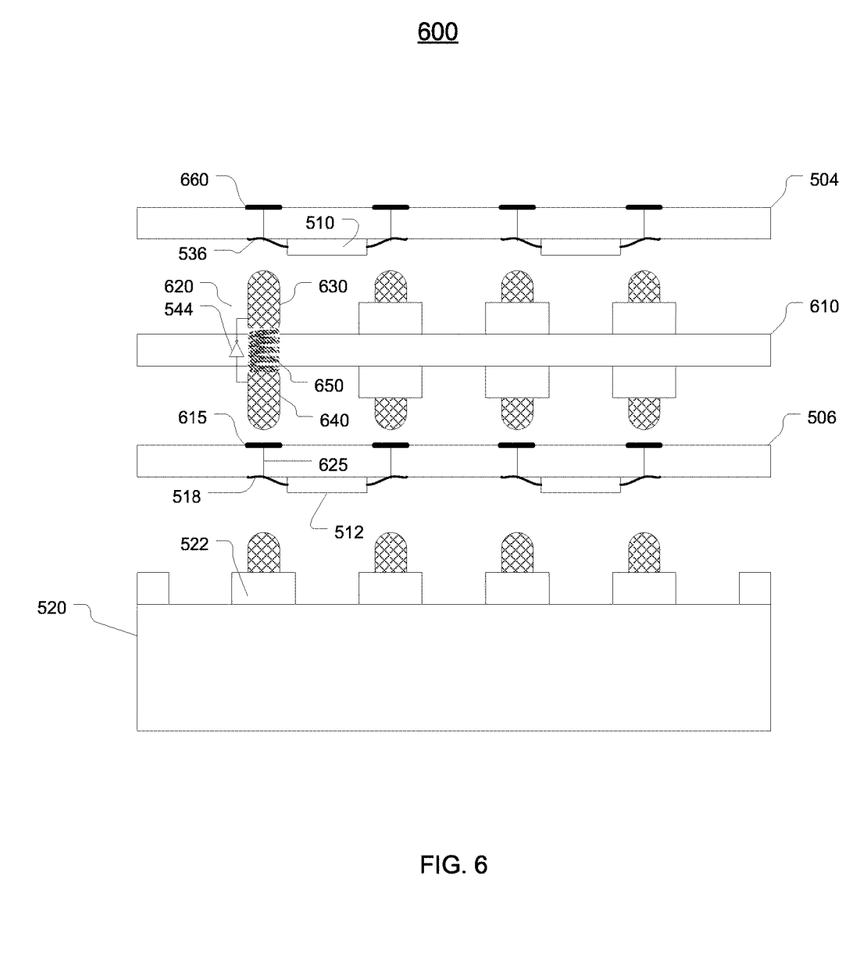
FIG. 6 is a simplified side view of a stackable assembly strip test configuration according to an embodiment of the present invention.

In various embodiments, assembly strips with test points that can be probed from both the top and the bottom may be included in a stackable assembly strip test adapter arrangement such as the arrangement of FIG. 6.

FIG. 6 is a simplified side view of a stackable assembly strip test configuration 600 according to an embodiment of the present invention. It includes a bed of nails tester 520, an assembly strip 506, an assembly strip 504, and a stackable assembly strip test adapter 610.

In use, the assembly strip 506 is placed on top of the tester 520, the stackable assembly strip test adapter 610 is placed on top of the assembly strip 506, and the assembly strip 504 is placed on top of the stackable assembly strip test adapter 610.

The tester 520 includes a number of spring-loaded test probes, such as the test probe 522, while the assembly strip 506 includes a number of integrated circuits under test, such as the integrated circuit 512. Each integrated circuit has a number of test points, such as the test point 518. When the assembly strip 506 is placed on top of the tester 520, the test probe 522 makes contact with the test point 518. A via 625 provides a conductive path between the test point 518 and a contact point 615 on the opposite side of the assembly strip 506 corresponding to the test point 518.

The stackable assembly strip test adapter 610 includes a number of dual-sided spring-loaded via probes such as the via probe 620 (shown in cutaway view for clarity of discussion). The via probe 620 includes a lower probe head 640, an upper probe head 630, and a spring-loading mechanism 650. In some embodiments, the spring-loading mechanism 650 may be conductive and allow direct electrical contact between the lower probe head 640 and the upper probe head 630. In other embodiments such as that of the arrangement 600, the spring-loading mechanism 650 is non-conductive, and a mechanism is provided that allows circuitry to be inserted between the lower and upper probe heads 640 and 630, respectively, such as the inverter and associated wiring circuitry 544.

In operation, when the stackable assembly strip test adapter 610 is placed on top of the assembly strip 506, the lower probe heads of the via probes (such as the lower probe head 640 of the via probe 620) make contact with the contact points on the upper side of the assembly strip 506 (such as the contact point 615), and thereby make contact by virtue of the vias (such as the via 625), with the test points on the bottom side of the assembly strip 506 (such as the test point 518).

By stacking the assembly strip 506 on top of the tester 520 and the stackable assembly strip adapter 610 on top of the assembly strip 506, an electrical connection is made between the lower test probe head 640 of the via probe 620, all the way through the adapter to the test point 518 of the integrated circuit 512. Additionally, the upper probe head 630 is electrically connected (as illustrated through the inverter 544 or optionally via a simple wire (not illustrated)) to the lower probe head 640 and thereby also electrically connected all the way through to the test point 518, and finally from there to the test probe 522.

The assembly strip 504 is designed similarly to the assembly strip 506, and, in operation, when the assembly strip 504 is placed on top of the stackable assembly strip adapter 610, which is placed on top of the assembly strip 506, which is placed on top of the bed of nails tester 520, the test points of the assembly strip 504 (such as the test point 536) will be electrically connected all the way through to the corresponding test probes of the tester 520 (such as the test probe 522).

Note that the inverter 544 of the via probe 620 allows the test probe 522 to effectively select between testing the integrated circuit 512 of the assembly strip 506 and the integrated circuit 510 of the assembly strip 504.

Alternatively or additionally, in other embodiments, inverters or decoders may be wired externally (not shown) to the stackable assembly strip adapter arrangement (e.g., on headers located on the individual assembly strips), which inverters or decoders allow the selection of a subset of the assembly strips (or integrated circuits) for testing concurrently. In other embodiments, the individual assembly strips (or integrated circuits) may be chosen by selectively powering some assembly strips versus others.

Note that the contacts (such as the contact 660 on the upper side of the assembly strip 504) allow extension of the stackable assembly strip adapter concept to additional assembly strips and in general the approach can be used for up to N assembly strips.

In various embodiments, chip selects may be the only test points that are not directly connected in this vertical stack manner, but may rather be driven by a separate decoder.

In various embodiments, the decoder logic for chip selection may be built into the integrated circuits (potentially in a distributed fashion) so that no chip selection logic is required in the assembly strips or assembly strip adapters. Such an arrangement is illustrated by FIG. 7.

Figure 7:
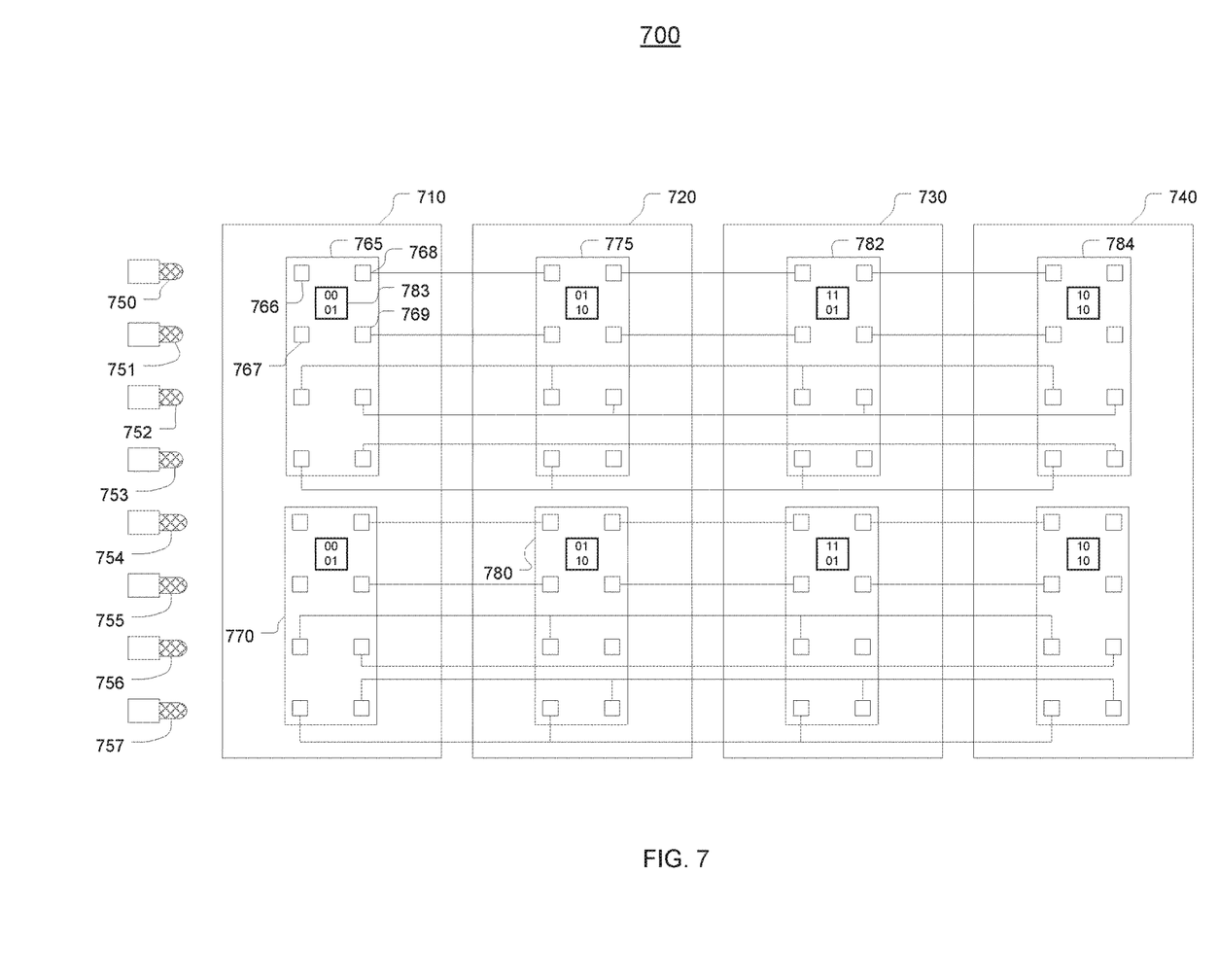
FIG. 7 is a simplified plan view of an assembly strip test arrangement according to an embodiment of the present invention.

FIG. 7 is a simplified plan view of an assembly strip test adapter configuration 700 according to an embodiment of the present invention. It includes four assembly strips 710, 720, 730 and 740 and eight test probes 750, 751, 752, 753, 754, 755, 756, and 757. Each assembly strip includes two integrated circuits. For example, the assembly strip 710 includes the integrated circuits 765 and 770, and the assembly strip 720 includes the integrated circuits 775 and 780, respectively.

Each integrated circuit includes eight test points. However, a subset of the test points are used to implement an integral distributed assembly strip selection decoder where the logic for the selection of the one-of-N assembly strips is built into the integrated circuits themselves.

In the configuration 700, the upper four pins of each integrated circuit are dedicated to implementation of the integral distributed assembly strip selection decoder, while the lower four pins are regular test points that are tested as part of a test procedure during assembly strip testing. Specifically, the test points 766 and 767 are inputs for the integral selection decoder, and the test points 768 and 769 are outputs of the integral selection decoder, respectively, that is built into the integrated circuit 765. Thus, the upper four pins of each of the integrated circuits of the assembly strips 710, 720, 730, and 740 are wired in an input-to-output cascade manner, while the lower four pins are wired such that corresponding pins are wired in parallel across the assembly strips, as illustrated.

Note that the integral decoding logic embedded in each of the integrated circuits of the assembly strips is identical to that embedded in the other integrated circuits. Specifically, the logic in this example implements a simple two-bit combinatorial counter. To be clear, when the dual input of the integral selection decoder is presented with a two-bit count, the dual output will be one count higher. Specifically when the inputs to the logic (e.g., test points 766 and 767) are binary '00', the outputs (e.g., test point 768 and 769) are '01'. When the inputs are '01', the outputs are '10', and when the inputs are '10', the outputs are '11'. In this embodiment, only when the inputs to the integral decoder logic of a chip are '11' is the associated integrated circuit selected for testing.

An example state of the counter combinatorial logic is illustrated by the logic state detail box included in the upper portion of each of the upper ICs of the assembly strips (e.g., the logic state detail box 783 of the integrated circuit 765).

In operation, the test probes 750 and 751 are first set to output a two-bit count of '00', and the first assembly strip 710 is moved to the left to make contact between the test points of the integrated circuits of the first assembly strip 710 and the test probes 750-757. In particular, the test probes 750 and 751 make contact with the test points 766 and 767, respectively, of the integrated circuit 765, which points correspond to the inputs to the integral decoder logic of the integrated circuit 765. Per the counter logic explained earlier, when the input test points 766 and 767 are driven to '00', the outputs pins 768 and 769 are driven to 01 as illustrated by the logic state detail box 783. Other than for those two pins, the outputs of the integrated circuit 765 remain in tri-state. Similarly, the test probes 754 and 755 are configured to output a '00' and make contact with the corresponding integral decoder logic input pins of the integrated circuit 770. The test probes 752 and 753, and the test probes 756 and 757, (along with other test probes (not shown)) would be used for testing the remaining four test points of the integrated circuits 765 and 770, respectively.

In a cascade manner, the output pins 768 and 769 drive the decoder logic input pins of the integrated circuit 775 of the assembly strip 720. The integral decoder logic of the integrated circuit 775 receives the '01' output from the integrated circuit 765 and drives its own output with the next binary count '10'. The integrated circuit 782 of the third assembly strip 730 receives the '10' output from the integrated circuit 775 and drives its own output to '11'. Finally, integrated circuit 784 receives the '11' that is output from the integrated circuit 782 and, upon receiving this input, considers itself selected for test. As would be expected, the integrated circuit 784 drives its own decoder outputs to '00', but because its decoder outputs are not connected to anything, this output is of no consequence.

As can be seen from the detail of the rest of the wiring interconnect between the assembly strip integrated circuits of the test arrangement 700, other than for the integral decoding logic wiring of the top four pins of each of the lower integrated circuits of each assembly strip (such as the top four pins of the integrated circuits 770 and 780 of the assembly strips 710 and 720, respectively, which are wired in an input-to-output cascade manner similar to the wiring of the top four pins of the upper integrated circuits 765, 775, 782, and 784) the corresponding pins of the integrated circuits of the assembly strips are wired in parallel.

The assembly strips 710, 720, 730, and 740 may be mounted on any of the assembly strip adapter arrangements of the other embodiments. For example, the assembly strips of the arrangement 700 may be mounted using a stackable assembly strip test adapter, such as that of FIG. 6, where either the adapter board 610 or the assembly strips (e.g., the assembly strip 506) or a combination thereof might implement the wiring between assembly strips required to implement the assembly strip selection per the example of FIG. 7. To avoid damage during assembly strip testing, in practice, the integral distributed assembly strip selection decoders might be tested prior to use in assembly strip testing (e.g., during wafer testing) to avoid a failure in the logic that might allow selection of more than one board at a time.

In still other embodiments, rather than decoding test probe outputs to chip selects, test probes outputs may be used to drive a one-of-N power-gating mechanism that powers only one assembly strip at a time. Such a selective power-gating mechanism may be preferable for some circumstances, but could also cause delay when switching between the testing of one assembly strip to another based on a duration of a power-up sequence associated with the integrated circuits on the assembly strips.

In still another embodiment, inverters or one-of-N decoders may be used to drive output enable pins on the integrated circuits instead of a chip select.

In still other embodiments, given that only a subset of pins on an integrated circuit need be used for testing, the assembly strip test adapter 502 of FIG. 5 may be utilized to carry multiple assembly strips and route test probe connections from a strip tester bed of nails to a multitude of assembly strips.

For example, consider a tester with twenty-four test probes and an assembly strip such as the second assembly strip 506 of FIG. 5, where only two pins per integrated circuit are used to test the integrated circuit (i.e., twelve per assembly strip). By using an assembly strip test adapter that carries two assembly strips and includes one twenty-four pin test point array interface (which interface is divided so as to couple twelve test signals to each of the two assembly strips), this assembly strip test adapter could be loaded into the strip tester once and yet allow two assembly strips to be tested in parallel in a single test cycle. Such an embodiment is illustrated in FIG. 9.

Figure 9:
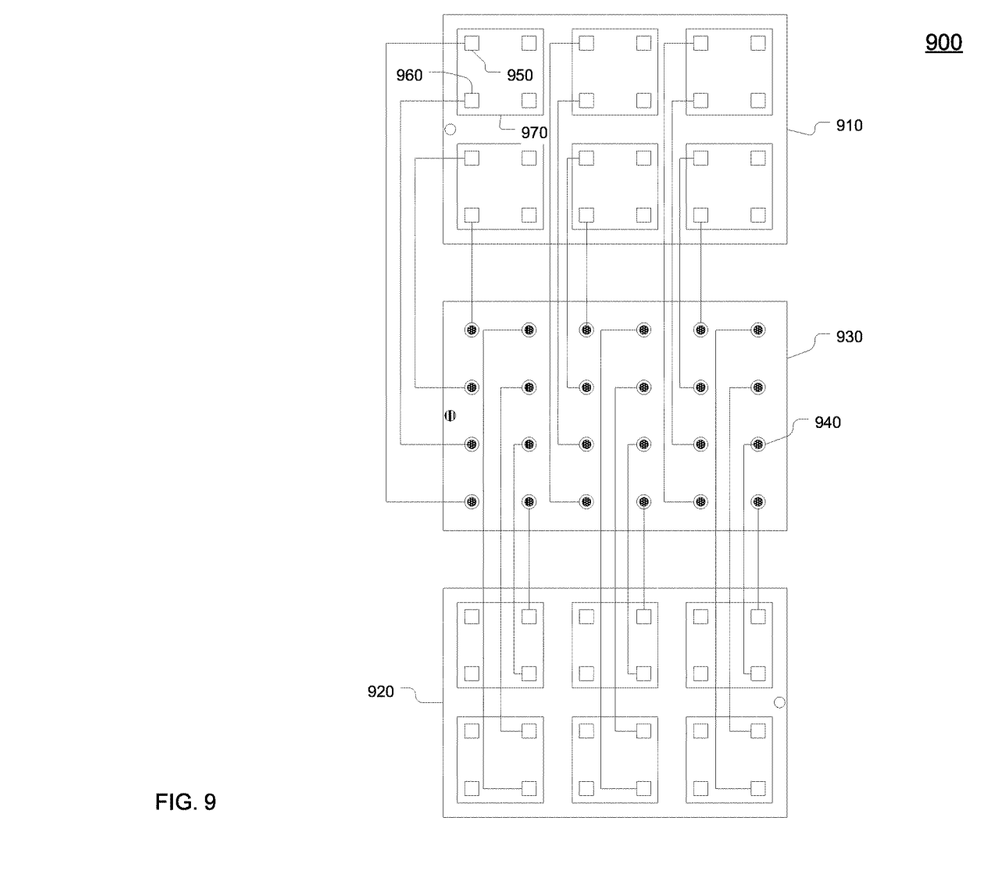
FIG. 9 is a simplified plan view of an assembly strip test adapter according to an embodiment of the present invention.

FIG. 9 is a schematic diagram of a dual assembly strip test adapter 900 according to an embodiment of the present invention. The test adapter 900 includes a first assembly strip 910, a second assembly strip 920, and a strip tester interface 930 (e.g., a socket that emulates the form factor of an assembly strip for ease of interface of the test adapter 900 to a strip tester). The strip tester interface 930 is configured such that the contact points of the interface (e.g., such as the contact points 940) line up with the test probes of the strip tester. As illustrated, since only two of the test points on each integrated circuit are utilized (e.g., the test points 950 and 960 of the integrated circuit 970 of the first assembly strip 910), they are the only ones wired by the adapter 900 via the interface 930 to the strip tester.

For ease of illustration, the second assembly strip 920 is shown as oriented with the same side up but with the orientation in the opposite direction from the orientation of the first assembly strip 910. In practice, this may also simplify the routing of traces in the test adapter 900 from the strip tester interface to the assembly strips. From this example, it can be seen that a single strip tester bed of nails can be utilized to test two separate assembly strips, and one load and test cycle can accomplish the testing of two assembly strips.

In other embodiments, the embodiment described with reference to FIG. 9 (that of sharing a strip tester bed of nails with multiple assembly strips via an adapter), may be combined in various ways with the embodiment described with reference to FIG. 5 (that of chip selecting subsets of assembly strips via an adapter) to get further improvements in utilization and testing speed.

Using assembly strip test adapters that carry greater than two assembly strips can further improve tester utilization, but potentially with diminishing returns. Combining (a) test adapters that support more than two assembly strips with (b) an embodiment where a single test bed can be shared concurrently among multiple assembly strips, may also further increase utilization.

Unless stated otherwise, terms such as "first" and "second" are used to arbitrarily distinguish between the elements such terms describe. Thus, these terms are not necessarily intended to indicate temporal or other prioritization of such elements. Further, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The invention claimed is:

1. An assembly strip test adapter, comprising:
   at least first and second sites for respectively mounting at least first and second assembly strips, each assembly strip having a plurality of integrated circuits, wherein test points for the integrated circuits of the first assembly strip are adapted to contact corresponding test probes of a strip tester; and
   electrical coupling between the test points for the integrated circuits of the first assembly strip and corresponding test points for the integrated circuits of the second assembly strip, wherein:
      a first test point for a first integrated circuit of the first assembly strip is adapted to receive a signal from a first test probe of the strip tester; and
      the electrical coupling is adapted to convey the signal from the first test point to a second test point for a second integrated circuit of the second assembly strip, wherein the signal is adapted to be first used for testing the first assembly strip via the strip tester during a first test cycle and then used for testing the second assembly strip via the strip tester during a second test cycle.

2. The test adapter of claim 1, wherein:

the electrical coupling includes at least one signal logic inverter;
the first test point is a chip select for the first integrated circuit;
the second test point is a chip select for the second integrated circuit;
the signal is coupled from the first test probe to the chip select for the first integrated circuit;
the signal is also coupled to the logic inverter; and
the output of the logic inverter is coupled to the chip select for the second integrated circuit, such that:
when the signal is at a first level during the first test cycle, the first integrated circuit is selected for testing and the second integrated circuit is de-selected; and
when the signal is at a second level, different from the first level, during the second test cycle, the first integrated circuit is de-selected and the second integrated circuit is selected for testing.

3. The test adapter of claim 1, wherein:
the test adapter provides N sites for mounting N assembly strips, N>2;
the test adapter provides contact for at least two test probes dedicated to assembly strip selection;
signals from the at least two test probes are used to drive a one-of-N decoder of the first integrated circuit; and
outputs of the one-of-N decoder are used to select between the N assembly strips for testing.

4. The test adapter of claim 1, wherein:
the test adapter comprises a plurality of via probes, each via probe comprising a lower probe head and an upper probe head electrically interconnected by the electrical coupling;
the lower probe heads form the first site for mounting the first assembly strip on a lower side of the test adapter; and
the upper probe heads form the second site for mounting the second assembly strip on an upper side of the test adapter.

5. The test adapter of claim 1, where the test adapter is adapted to be used with a strip tester test bed comprising a two-dimensional matrix of test probes whose locations on the strip tester test bed correspond to locations of the test points for the integrated circuits of the first assembly strip.

6. The test adapter of claim 1, wherein the test adapter is adapted to be loaded with the first and second assembly strips prior to the first test cycle for the first assembly strip.

7. The test adapter of claim 1, where the first site for mounting the first assembly strip is substantially on top of the second site for mounting the second assembly strip such that mounting the first and second assembly strips corresponds roughly to stacking the first and second assembly strips.

8. The test adapter of claim 1, wherein the first integrated circuit includes integral distributed assembly strip selection decoding logic, the logic used to receive the signal received from the first test probe and contribute to the selection of the first assembly strip for testing.

9. An assembly strip testing method, comprising:
providing at least first and second sites for respectively mounting at least first and second assembly strips in an assembly strip test adapter, each assembly strip having a plurality of integrated circuits, wherein test points for the integrated circuits of the first assembly strip contact corresponding test probe of a strip tester; and
providing electrical coupling between the test points for integrated circuits of the first assembly strip and corresponding test points for the integrated circuits of the second assembly strip,
wherein:
a first test point for a first integrated circuit of the first assembly strip receives a signal from a first test probe of the strip tester; and
the electrical coupling conveys the signal from the first test point to a second test point for a second integrated circuit of the second assembly strip, wherein the signal is first used for testing the first assembly strip via the strip tester during a first test cycle and then used for testing the second assembly strip via the strip tester during a second test cycle.

10. The assembly strip testing method of claim 9, comprising:
including at least one signal logic inverter within the electrical coupling, wherein:
the first test point is a chip select for the first integrated circuit; and
the second test point is a chip select for the second integrated circuit;
coupling the signal from the first test probe to the chip select for the first integrated circuit;
coupling the signal to the logic inverter; and
coupling the output of the logic inverter to the chip select for the second integrated circuit, such that:
when the signal is at a first level during the first test cycle, the first integrated circuit is selected for testing and the second integrated circuit is de-selected; and
when the signal is at a second level, different from the first level, during the second test cycle, the first integrated circuit is de-selected and the second integrated circuit is selected for testing.

11. The assembly strip testing method of claim 9, comprising:
providing the test adapter with N sites for mounting N assembly strips, N>2;
providing contact via the test adapter for at least two test probes dedicated to assembly strip selection;
using signals from the at least two test probes to drive a one-of-N decoder of the first integrated circuit; and
using the outputs of the one-of-N decoder to select between the N assembly strips for testing.

12. The assembly strip testing method of claim 9, comprising:
providing the test adapter comprising a plurality of via probes, each via probe comprising a lower probe head and an upper probe head electrically interconnected by the electrical coupling, wherein:
the lower probe heads form the first site for mounting the first assembly strip on a lower side of the test adapter; and
the upper probe heads form the second site for mounting the second assembly strip on an upper side of the test adapter.

13. The assembly strip testing method of claim 9, comprising using the test adapter to couple the test adapter to a strip tester test bed comprising a two-dimensional matrix of test probes whose locations on the strip tester test bed correspond to locations of the test points for the integrated circuits of each assembly strip.

14. The assembly strip testing method of claim 9, wherein the test adapter is loaded with the first and second assembly strips prior to the first test cycle for the first assembly strip.

15. The assembly strip testing method of claim 9, wherein the first site for mounting the first assembly strip is substantially on top of the second site for mounting the second assembly strip such that mounting the first and second assembly strips corresponds roughly to stacking the first and second assembly strips.

16. The assembly strip testing method of claim 9, wherein the first integrated circuit includes integral distributed assembly strip selection decoding logic, wherein the logic is used to receive the signal received from the first test probe and contribute to the selection of the first assembly strip for testing.

\* \* \* \* \*